(12) United States Patent
Nakamura et al.

(10) Patent No.: US 10,162,425 B2
(45) Date of Patent: Dec. 25, 2018

(54) INPUT DEVICE AND ELECTRONIC DEVICE IN WHICH SAME IS USED

(71) Applicant: Panasonic Intellectual Property Management Co., Ltd., Osaka (JP)

(72) Inventors: Takaya Nakamura, Osaka (JP); Naoyuki Takagi, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/546,174

(22) PCT Filed: Dec. 4, 2015

(86) PCT No.: PCT/JP2015/006021
§ 371 (c)(1),
(2) Date: Jul. 25, 2017

(87) PCT Pub. No.: WO2016/125216
PCT Pub. Date: Aug. 11, 2016

(65) Prior Publication Data
US 2018/0018023 A1  Jan. 18, 2018

(30) Foreign Application Priority Data
Feb. 4, 2015 (JP) .................. 2015-020509

(51) Int. Cl.
*G06F 3/02* (2006.01)
*H01H 9/18* (2006.01)
(Continued)

(52) U.S. Cl.
CPC ............ *G06F 3/0202* (2013.01); *B60K 35/00* (2013.01); *G06F 1/1626* (2013.01);
(Continued)

(58) Field of Classification Search
CPC ...... G06F 3/0202; G06F 1/1671; G06F 3/044; G06F 1/1626; G06F 3/02; B60K 35/00;
(Continued)

(56) References Cited

U.S. PATENT DOCUMENTS 6,246,019 B1 * 6/2001 Nakamura ........... H01H 13/702
 200/5 R
8,836,486 B2 * 9/2014 Saito .................. G07C 9/00944
 340/12.55

(Continued)

FOREIGN PATENT DOCUMENTS

CN 203859845 U 10/2014
JP 2012-084002 4/2012

OTHER PUBLICATIONS

International Search Report of PCT application No. PCT/JP2015/006021 dated Feb. 23, 2016.
(Continued)

*Primary Examiner* — Jose Soto Lopez
(74) *Attorney, Agent, or Firm* — McDermott Will & Emery LLP (57) ABSTRACT

An input device includes a touch panel incorporating a switch electrode region, and an actuator. The switch electrode region includes a switch electrode and a ground electrode disposed side by side with the switch electrode. The actuator includes a push button having an operation surface, an elastic body, a conductor, and a facing surface. The conductor faces the switch electrode region and is separated from the switch and ground electrodes. The conductor moves in line with a press put on the push button such that a capacitance value between the conductor and each of the switch and ground electrodes changes in response to a distance between the conductor and the switch electrode.

13 Claims, 9 Drawing Sheets

(51) Int. Cl.
| | |
|---|---|
| *H01H 13/00* | (2006.01) |
| *H01H 13/78* | (2006.01) |
| *H01H 36/00* | (2006.01) |
| *G06F 3/044* | (2006.01) |
| *H01H 13/14* | (2006.01) |
| *B60K 35/00* | (2006.01) |
| *G06F 1/16* | (2006.01) |

(52) U.S. Cl.
CPC .............. *G06F 1/1671* (2013.01); *G06F 3/02* (2013.01); *G06F 3/044* (2013.01); *H01H 9/18* (2013.01); *H01H 13/00* (2013.01); *H01H 13/14* (2013.01); *H01H 13/78* (2013.01); *H01H 36/00* (2013.01)

(58) Field of Classification Search
CPC ........ H01H 13/14; H01H 36/00; H01H 13/78; H01H 13/00; H01H 9/18
See application file for complete search history.

(56) References Cited

U.S. PATENT DOCUMENTS

| | | | | |
|---|---|---|---|---|
| 9,748,952 B2* | 8/2017 | Bolender | ................ | G01L 1/142 |
| 9,804,703 B2* | 10/2017 | Kim | ..................... | G06F 1/1643 |
| 2003/0039114 A1* | 2/2003 | Douzono | ............. | G06F 1/1616 |
| | | | | 362/84 |
| 2003/0222660 A1* | 12/2003 | Morimoto | ............... | G01L 1/142 |
| | | | | 324/661 |
| 2004/0080216 A1* | 4/2004 | Morimoto | ............... | G01L 1/142 |
| | | | | 307/125 |
| 2008/0088600 A1* | 4/2008 | Prest | ................... | G06F 3/03547 |
| | | | | 345/173 |
| 2009/0051371 A1* | 2/2009 | Morimoto | ............ | G01D 5/2412 |
| | | | | 324/661 |
| 2009/0201031 A1* | 8/2009 | Morimoto | ............ | G01D 5/2417 |
| | | | | 324/661 |
| 2010/0024573 A1* | 2/2010 | Daverman | .............. | G01L 1/142 |
| | | | | 73/862.626 |
| 2011/0102326 A1* | 5/2011 | Casparian | ............... | G06F 3/016 |
| | | | | 345/168 |
| 2011/0298699 A1* | 12/2011 | Goto | ..................... | G06F 3/0202 |
| | | | | 345/156 |
| 2013/0076649 A1* | 3/2013 | Myers | ................ | H04M 1/0268 |
| | | | | 345/173 |
| 2014/0062933 A1* | 3/2014 | Coulson | .................. | G06F 3/044 |
| | | | | 345/174 |
| 2015/0199023 A1* | 7/2015 | Hu | ........................ | G06F 3/0213 |
| | | | | 345/173 |
| 2015/0242675 A1* | 8/2015 | Pope | ....................... | G06F 3/044 |
| | | | | 382/124 |
| 2015/0301736 A1* | 10/2015 | Jung | ................... | G06F 3/04883 |
| | | | | 345/175 |
| 2015/0355768 A1* | 12/2015 | Kuwahara | ............ | G06F 3/0412 |
| | | | | 345/157 |
| 2017/0160831 A1* | 6/2017 | Hanumanthaiah | ... | H03K 17/962 |

OTHER PUBLICATIONS

English Translation of Chinese Search Report dated Sep. 18, 2018 for the related Chinese Patent Application No. 201580074366.6.

\* cited by examiner

INPUT DEVICE AND ELECTRONIC DEVICE IN WHICH SAME IS USED

CROSS-REFERENCE TO RELATED APPLICATIONS

This application is a U.S. national stage application of the PCT International Application No. PCT/JP2015/006021 filed on Dec. 4, 2015, which claims the benefit of foreign priority of Japanese patent application No. 2015-020509 filed on Feb. 4, 2015, the contents all of which are incorporated herein by reference.

TECHNICAL FIELD

The present invention relates to an input device for use in electronic devices, and to an electronic device including the input device.

BACKGROUND ART

A conventional input device will be described below. The conventional input device includes an actuator and a sensor electrode. The actuator has a first surface and a second surface, and includes a conductor. The first and second surfaces are formed on opposite sides of the actuator. The conductor is formed on the second surface. The actuator is disposed such that the conductor faces the sensor conductor. The actuator has a contact surface that is electrically connected to the conductor. For example, the contact surface of the actuator may be an area that is accessible to a person. Thus, the contact surface is formed at least on the first surface. The conventional input device gets a person's body to act as a ground when the person touches the contact surface with his/her finger. In other words, the touch causes a change in capacitance value between the sensor electrode and the conductor.

It should be noted that, for example, PTL 1 is known as a prior art document containing information related to the invention in this application.

CITATION LIST

Patent Literature

PTL 1: Unexamined Japanese Patent Publication No. 2012-84002

SUMMARY OF THE INVENTION

An input device includes a touch panel, a casing, and an actuator. The touch panel includes a substrate, a sensor electrode region, and a switch electrode region. The switch electrode region is disposed in a section excluding the sensor electrode region on the substrate. The switch electrode region includes a switch electrode and a ground electrode. The ground electrode is disposed side by side with the switch electrode. The casing includes an inner surface and an outer surface. The casing is combined with the touch panel so as to cover the switch electrode region.

The actuator includes a push button, an elastic body, a conductor, and a facing surface. The push button has an operation surface and a contact surface. The elastic body presses the contact surface against the inner surface of the casing. The conductor is formed on the facing surface. The operation surface and the facing surface are formed on opposite sides of the actuator. The conductor faces the switch electrode region. The conductor is separated from the switch and ground electrodes. A capacitance value between the conductor and each of the switch and ground electrodes changes in response to a distance between the conductor and the switch electrode.

According to the present invention described above, the conductor faces the switch and ground electrodes, and the capacitance value between the conductor and each of the switch and ground electrodes changes in response to a distance between the conductor and the switch electrode. In other words, this configuration obviates the necessity for the human body to act as a ground. This reduces the difference between capacitance value changes made by an operation with an insulator, e.g., a gloved hand, on the operation surface and capacitance value changes made by an operation with a bare hand on the operation surface. As a result, this configuration can detect an operation performed by an operator on the operation surface even if the operation surface is operated with a gloved hand of the operator or any other insulator, similarly to the operation performed with a bare hand on the actuator.

DESCRIPTION OF EMBODIMENT

An input device according to an exemplary embodiment and an electronic device including the input device will now be described.

Prior to describing an exemplary embodiment of the present invention, problems in a conventional device will briefly be described.

If an actuator of a conventional input device is operated with an insulator, e.g., a gloved hand, the input device observes a very small change in the capacitance value between a sensor electrode and a conductor. In such a case, the conventional input device may not detect the operation performed on the actuator.

The present invention provides an input device that can detect an operation performed on an actuator even if the actuator is operated with an insulator, e.g., a gloved hand.

First Exemplary Embodiment

Figure 3:
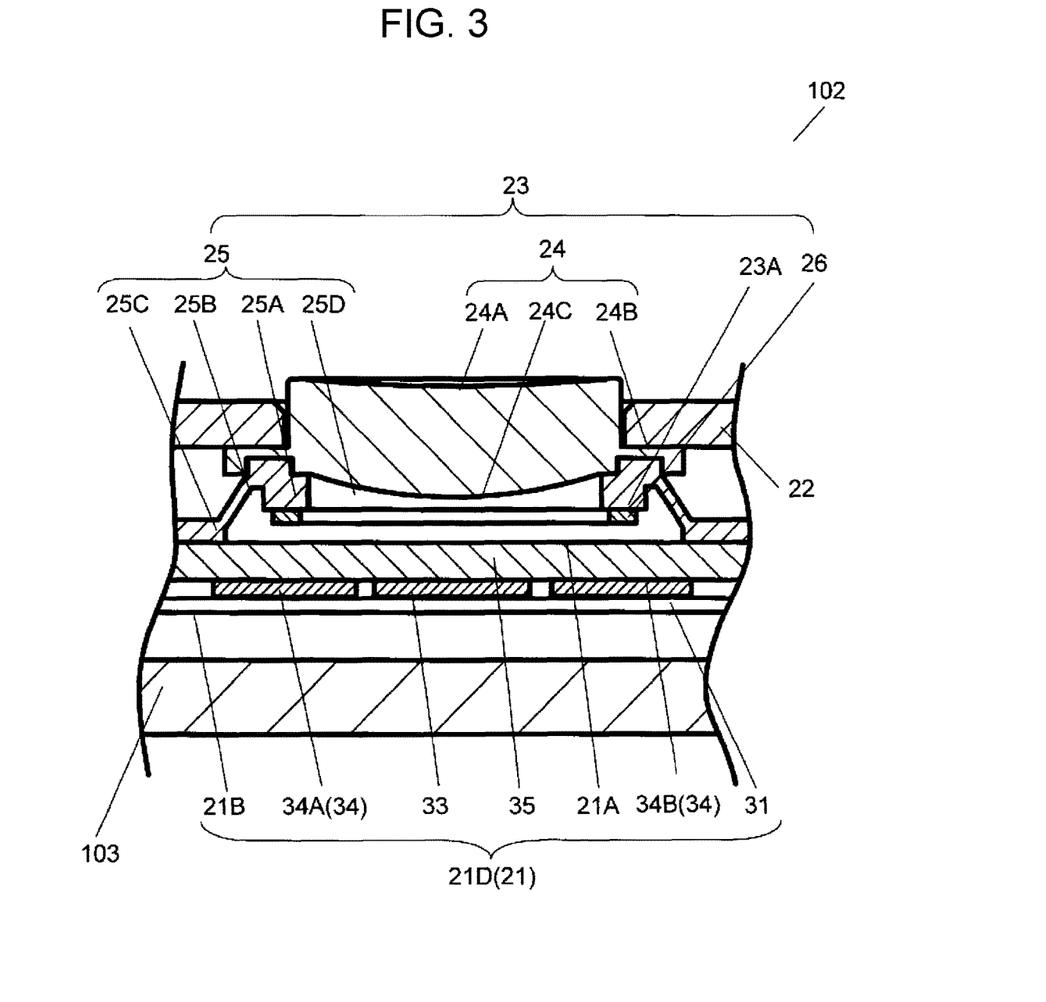
FIG. 3 is a cross-sectional view illustrating main components of the input device adopted for an electronic device according to the exemplary embodiment of the present invention.
Figure 7:
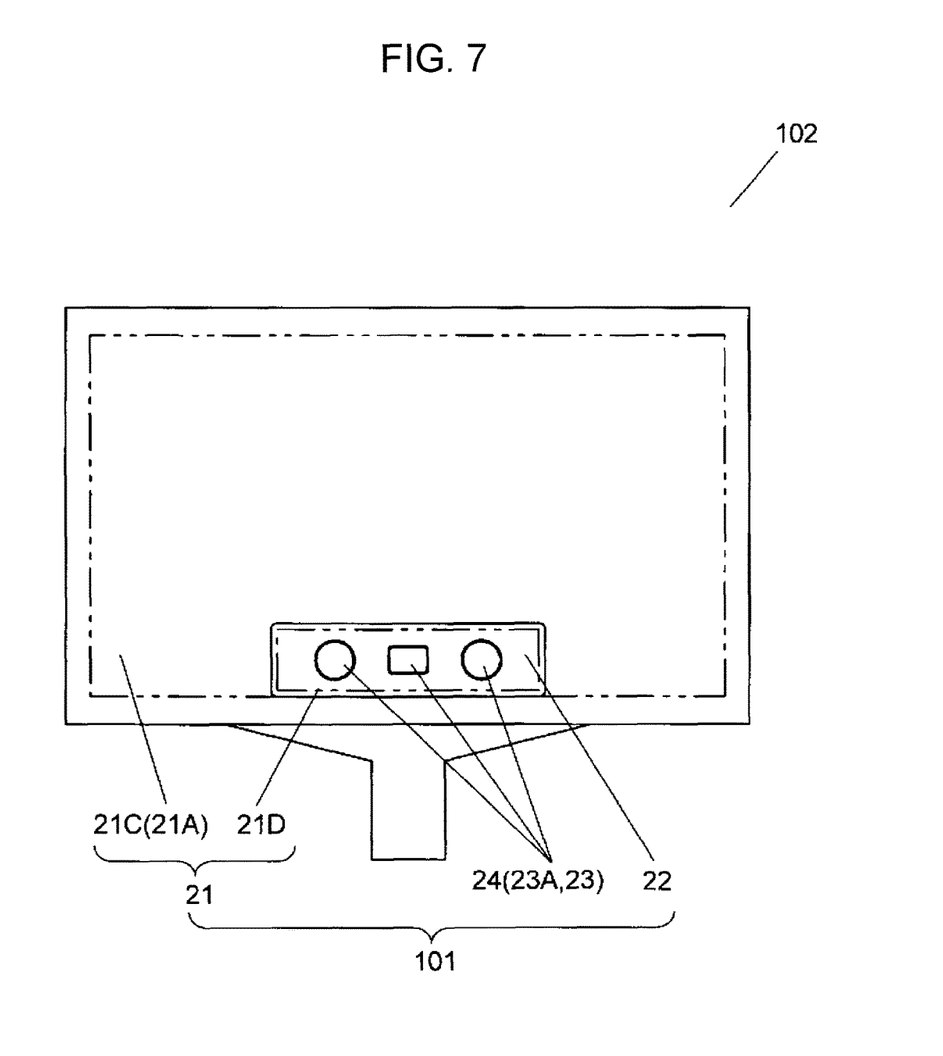
FIG. 7 is a front view of the electronic device according to the exemplary embodiment of the present invention.
Figure 8:
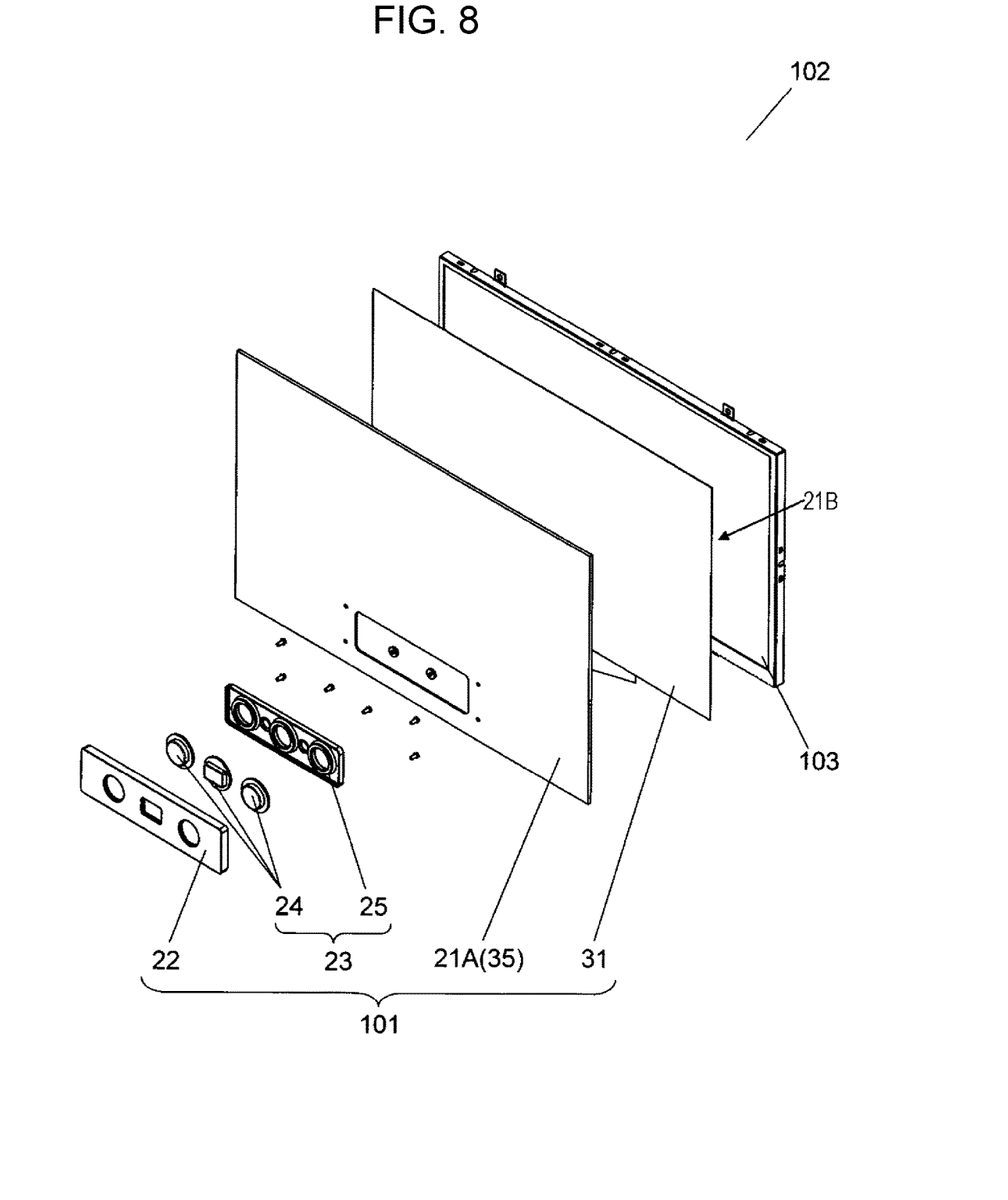
FIG. 8 is an exploded perspective view of the electronic device according to the exemplary embodiment of the present invention.

Prior to describing input device 101 according to the present exemplary embodiment, an overview of electronic device 102 will be described with reference to the attached drawings. FIG. 7 is a front view of electronic device 102. FIG. 8 is an exploded perspective view of electronic device 102. Electronic device 102 includes input device 101 and display 103. Input device 101 includes touch panel 21. Touch panel 21 includes operation surface 21A and light receiving surface 21B described later with reference to FIG. 3. Touch panel 21 has sensor electrode region 21C that acts as a flat touch sensor and switch electrode region 21D that detects an operation by a press on any of projection push buttons 24. Preferably, sensor electrode region 21C should act as an electrostatic sensor. In this case, touch panel 21 detects an operation performed on operation surface 21A via a change in electrostatic capacity owing to the operation. Touch panel 21 may incorporate any technology such as resistive membrane technology other than the electrostatic sensor. Display 103 faces light receiving surface 21B as shown in FIG. 3. Display 103 may be a liquid crystal display, for example. Display 103 may be an organic electroluminescence display, a light emitting diode display, or a plasma display, for example, other than the liquid crystal display.

Touch panel 21 includes switch electrode region 21D located below a center of touch panel 21 and sensor electrode region 21C located around switch electrode region 21D. Switch electrode region 21D is disposed in a section excluding sensor electrode region 21C. Sensor electrode region 21C has optical transparency. When electronic device 102 is viewed from outside operation surface 21A, display 103 is disposed behind light receiving surface 21B of sensor electrode region 21C and switch electrode region 21D. In other words, display 103 extends so as to face light receiving surface 21B shown in FIG. 3 and cover sensor and switch electrode regions 21C and 21D. If touch panel 21 incorporates electrostatic technology, sensor electrode region 21C detects an operation performed on operation surface 21A via a change in electrostatic capacity owing to the operation.

According to the configuration described above, indication on display 103 passes through touch panel 21. Thus, an operator can visually identify indication on display 103. In response to indication on display 103, the operator can enter data such as information or a command into electronic device 102 by operating operation surface 21A for sensor electrode region 21C via the operator's finger or any other item.

Figure 1A:
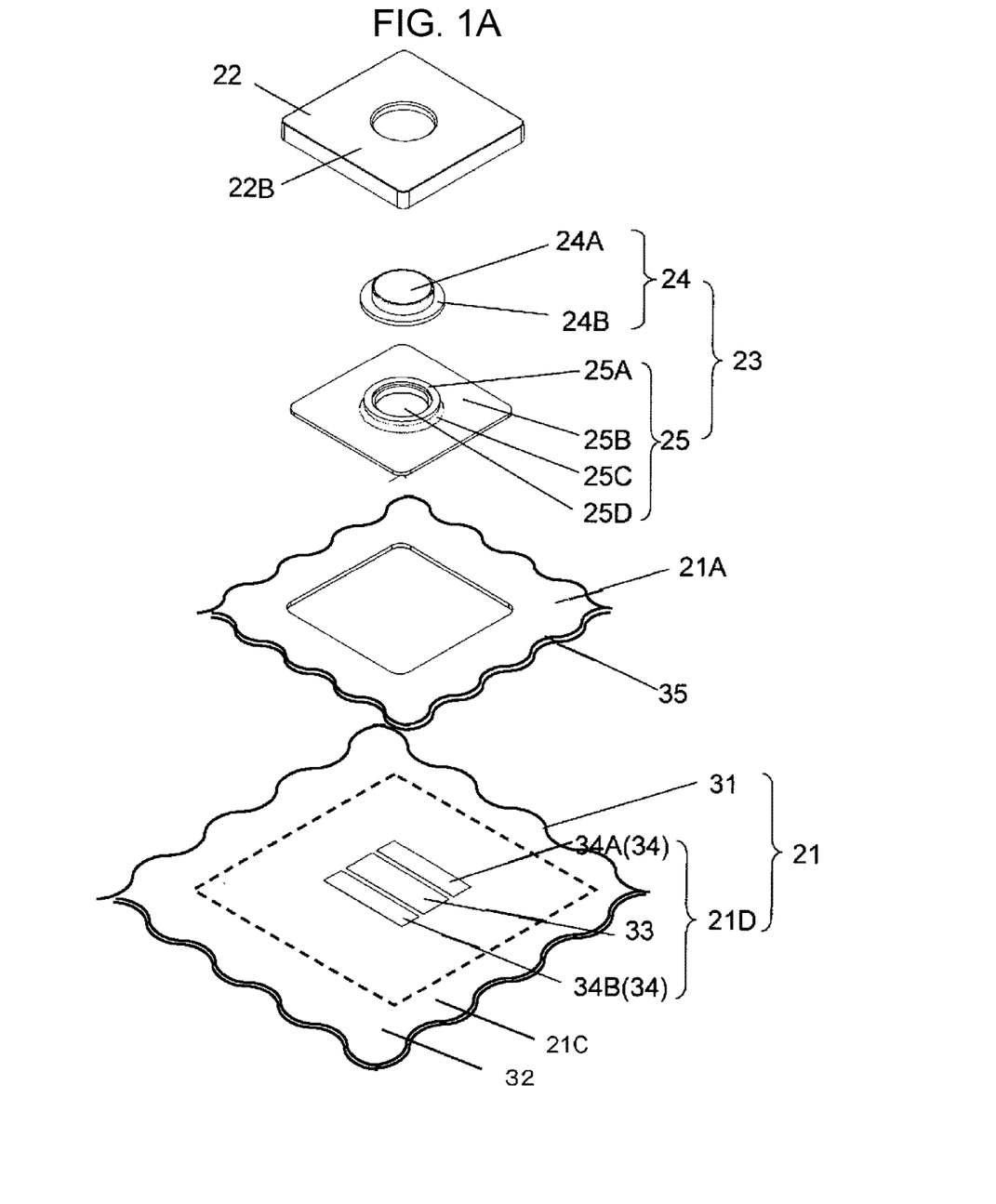
FIG. 1A is an exploded front perspective view of an input device according to an exemplary embodiment of the present invention.
Figure 1B:
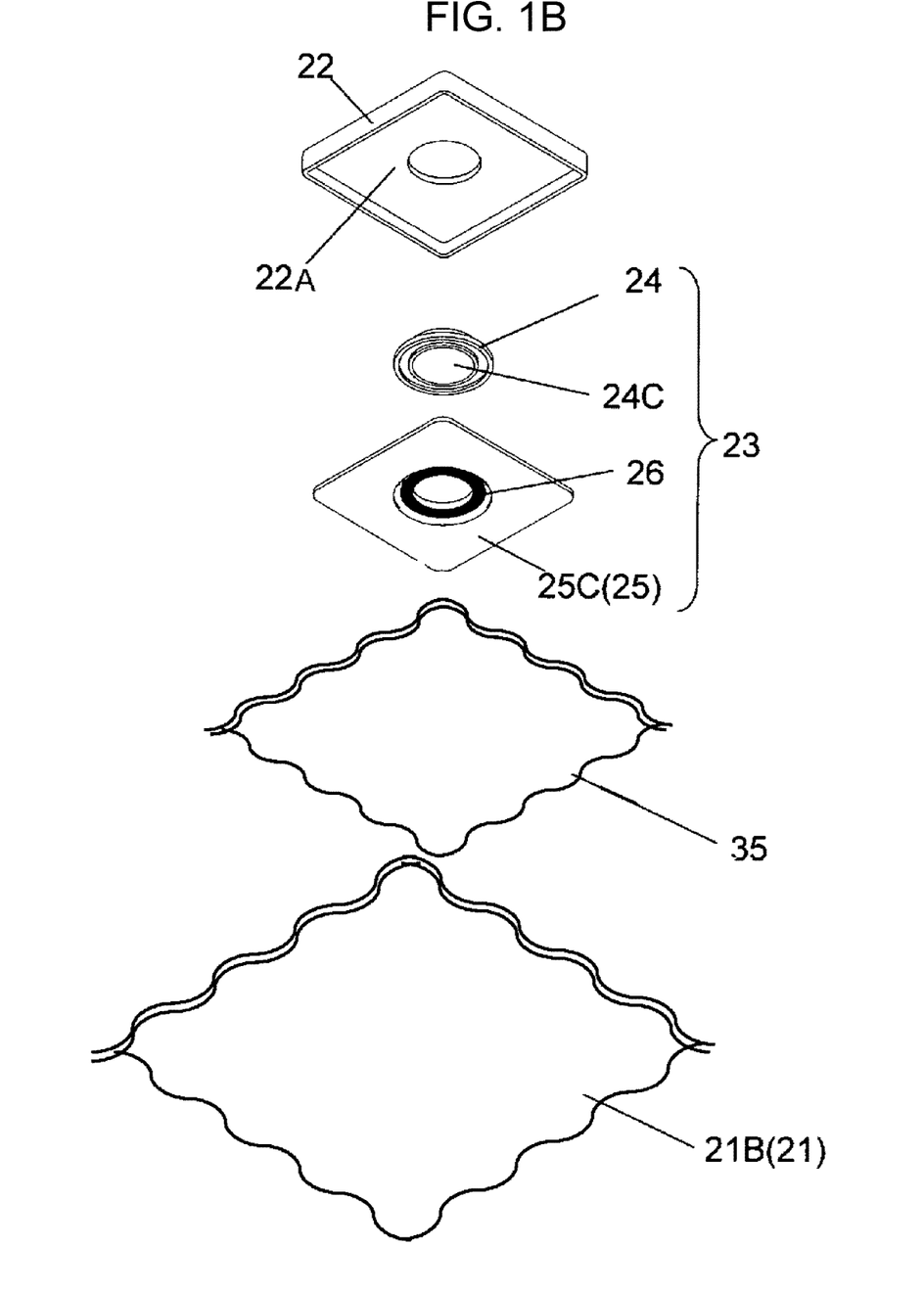
FIG. 1B is an exploded rear perspective view of the input device according to the exemplary embodiment of the present invention.
Figure 2:
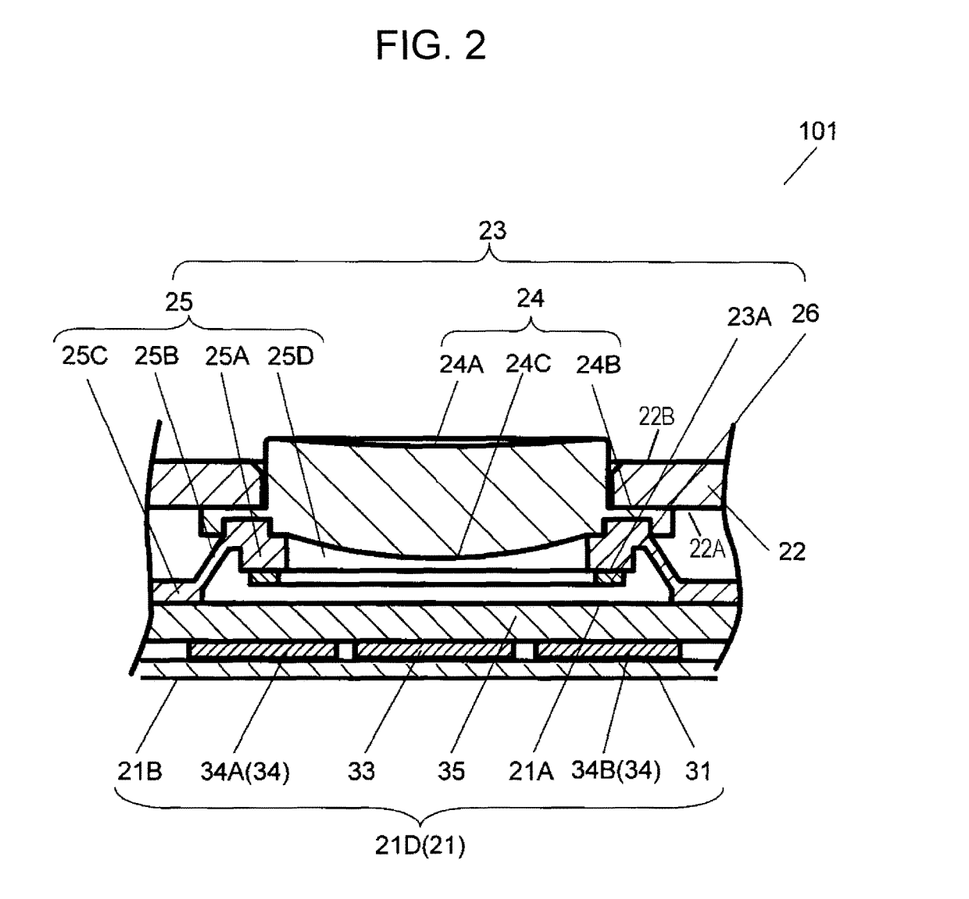
FIG. 2 is a cross-sectional view illustrating main components of the input device in a state of non-operation according to the exemplary embodiment of the present invention.

With reference to the drawings, switch electrode region 21D of input device 101 will now be described. As shown in FIGS. 7 and 8, three projection switch sections are disposed side by side with one another. In FIGS. 7 and 8, these three switch sections include one casing 22 having three holes, projection push buttons 24 inserted into the respective holes, and elastic body 25 having three openings and applying elastic force to push buttons 24. With reference to FIG. 8, a combination of three push buttons 24 and elastic body 25 forms actuator 23. FIG. 1A is an exploded front perspective view of input device 101 made up of one of the switch sections. FIG. 1B is an exploded rear perspective view of input device 101 of FIG. 1A. FIG. 2 is a cross-sectional view illustrating main components of input device 101 in a state of non-operation, wherein the components correspond to those in FIG. 1A. Input device 101 includes casing 22 and actuator 23. Touch panel 21 includes substrate 31 and switch electrode region 21D. FIG. 1A does not show an overall view of substrate 31. Sensor electrode region 21C is disposed around switch electrode region 21D indicated with a dotted line. Sensor electrode region 21C includes sensor electrode 32. Switch electrode region 21D is disposed in a section excluding sensor electrode region 21C on substrate 31. Switch electrode region 21D includes switch electrode 33 and ground electrode 34. Sensor, switch, and ground electrodes 32, 33, and 34 are provided on substrate 31. Ground electrode 34 is disposed side by side with switch electrode 33.

Casing 22 includes inner surface 22A and outer surface 22B. Outer surface 22B is disposed opposite inner surface 22A. Casing 22 is combined with touch panel 21 so as to cover switch electrode region 21D.

Actuator 23 includes push button 24, elastic body 25, conductor 26, and facing surface 23A. Push button 24 has operation surface 24A and contact surface 24B. Push button 24 includes a projection post and a flange disposed beneath the post. Operation surface 24A is formed on an upper face of the post, whereas contact surface 24B is formed on an upper face of the flange. Operation surface 24A juts out of casing 22, whereas contact surface 24B is pressed against inner surface 22A. Conductor 26 is formed on facing surface 23A. Operation surface 24A and facing surface 23A are formed on opposite sides of actuator 23. Conductor 26 is disposed so as to face switch electrode region 21D. Conductor 26 is separated from switch and ground electrodes 33 and 34. Conductor 26 moves in line with a press put on operation surface 24A by an operator. The capacitance value between conductor 26 and each of switch and ground electrodes 33 and 34 changes in response to a distance between conductor 26 and switch electrode 33.

According to the configuration described above, conductor 26 faces switch and ground electrodes 33 and 34, and the capacitance value between conductor 26 and each of switch and ground electrodes 33 and 34 changes in response to a distance between conductor 26 and switch electrode 33. In other words, this configuration obviates the necessity for the operator's finger (not illustrated) or any human body part to act as a ground. This reduces the difference between capacitance value changes made by an operation with an insulator, e.g., a gloved hand, on operation surface 24A and capacitance value changes made by an operation with a bare hand on operation surface 24A. As a result, this configuration can detect an operation performed by an operator on actuator 23 even if operation surface 24A is operated with a gloved hand of the operator or any other insulator, similarly to the operation performed with a bare hand on the actuator.

Input device 101 will now be described in more detail below. Substrate 31 is a film formed from an optically transparent material. Preferably, substrate 31 should be transparent. Substrate 31 may be formed from polyethylene terephthalate or any other thermoplastic resin having optical transparency, for example. Sensor electrode 32 is formed on one surface of substrate 31. Switch and ground electrodes 33 and 34 are formed on the surface of substrate 31 on which sensor electrode 32 is formed. Sensor electrode 32 has optical transparency. This configuration allows an operator to visually identify indication on display 103 through touch panel 21, as shown in FIG. 8.

Input device 101 can output a signal in response to a change in capacitance value between switch and ground electrodes 33 and 34. Signals output from input device 101 are applied to a controller (not illustrated). Consequently, the controller can detect an operation performed on operation surface 24A. The controller gets display 103 shown in FIG. 8 to display images.

Preferably, touch panel 21 should include insulating layer 35. FIGS. 1A and 1B each do not show an overall view of insulating layer 35. Insulating layer 35 has a hollow on its upper surface such that a perimeter of elastic body 25 having a substantially rectangular shape in plane view is positioned and fitted into the hollow. Insulating layer 35 covers sensor, switch, and ground electrodes 32, 33, and 34. Insulating layer 35 is disposed between switch electrode 33 or ground electrode 34 and conductor 26. This configuration prevents conductor 26 and switch electrode 33 or ground electrode 34 from being short-circuited when push button 24 is pressed. This in turn prevents switch and ground electrodes 33 and 34 from being short-circuited. Sensor, switch, and ground electrodes 32, 33, and 34 may be interposed between substrate 31 and insulating layer 35. Alternatively, insulating layer 35 may double as substrate 31. In this case, insulating layer 35 includes switch and ground electrodes 33 and 34 formed on one surface, and is disposed such that the other surface faces conductor 26. Alternatively, these electrodes may be embedded in insulating layer 35, for example. In these cases, insulating layer 35 may double as a lens cover that is provided on the operation surface of touch panel 21.

With reference to FIG. 8, it is preferred that display 103 extend up to switch electrode region 21D. This configuration enables display 103 to light actuator 23. Switch and ground electrodes 33 and 34 are formed on the surface of substrate 31 on which sensor electrode 32 is formed. Preferably, switch and ground electrodes 33 and 34 should have optical transparency. This configuration enables display 103 shown in FIG. 8 to illuminate actuator 23 and display an image on actuator 23. As a result, operation surface 24A can be illuminated and have a displayed image.

In this case, it is preferred that sensor, switch, and ground electrodes 32, 33, and 34 be each formed from a transparent material having electrical conductivity. Sensor, switch, and ground electrodes 32, 33, and 34 may be each formed from an indium-tin-oxide (ITO) film, for example. Sensor, switch, and ground electrodes 32, 33, and 34 may be formed from a conductor with an invisibly narrow width, other than transparent materials. Sensor electrode 32 may be formed on both sides of substrate 31, other than on one side of substrate 31.

Figure 4:
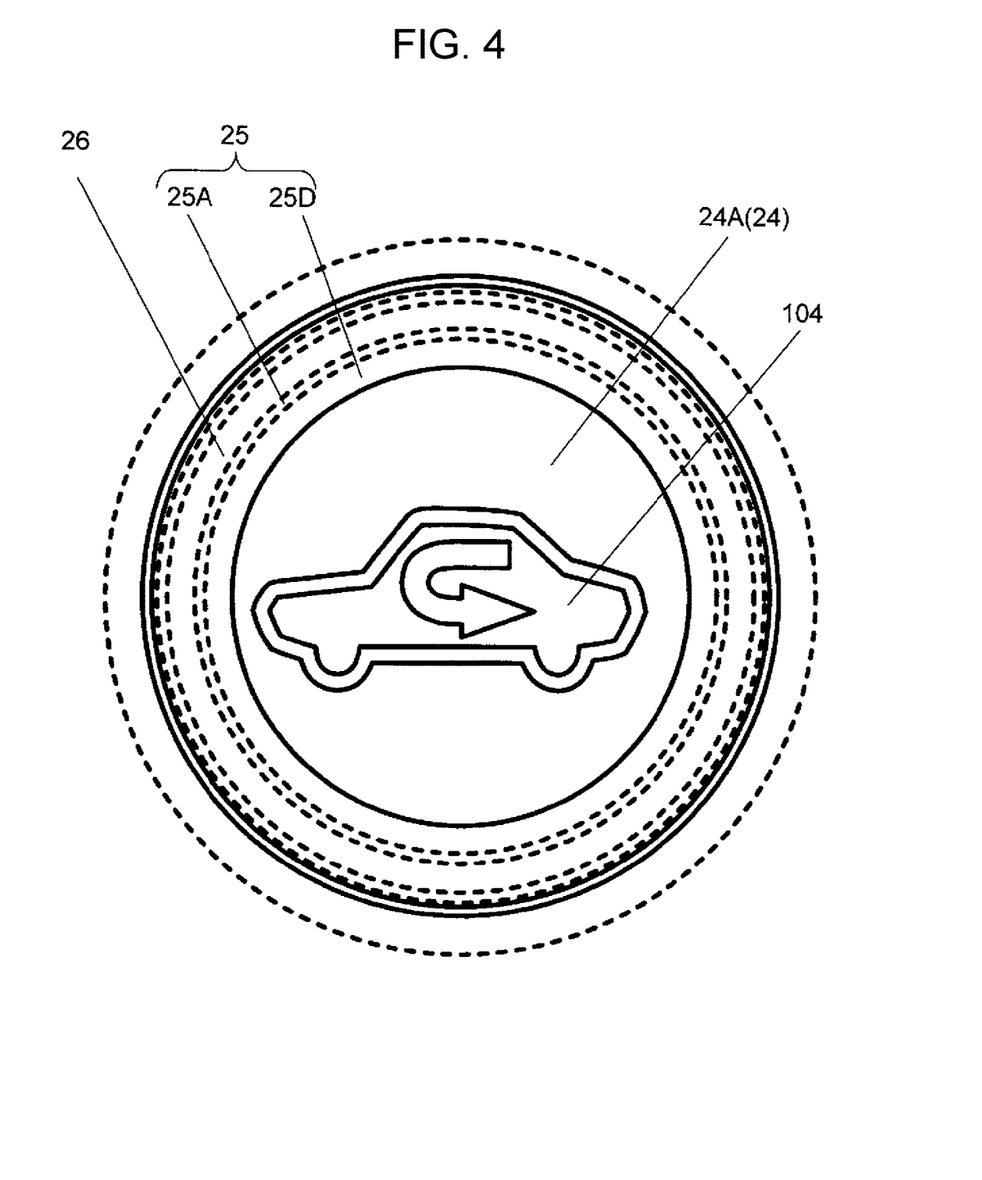
FIG. 4 is a front view of an actuator with an image displayed on an operation surface according to the exemplary embodiment of the present invention.

FIG. 3 is a cross-sectional view illustrating main components of electronic device 102. FIG. 4 is a front view of actuator 23 with image 104 displayed on operation surface 24A. Preferably, push button 24 should have optical transparency. In this case, push button 24 includes light receiving part 24C. Light receiving part 24C and operation surface 24A are formed on opposite sides of push button 24. Light receiving part 24C is disposed so as to face operation surface 21A for switch electrode region 21D. This configuration allows light or an image cast from display 103 to enter push button 24 through touch panel 21 and light receiving part 24C. Push button 24 guides light and image 104 cast from display 103 to operation surface 24A. It is more preferable that push button 24 be transparent. This configuration allows display 103 to more clearly display cast image 104 on operation surface 24A and more brightly illuminate operation surface 24A.

With reference to FIG. 2, elastic body 25 is disposed between push button 24 and operation surface 21A. Elastic body 25 includes first contact segment 25A, coupler 25B, and second contact segment 25C. First contact segment 25A is pressed against push button 24. Whereas, second contact segment 25C is pressed against operation surface 21A. Coupler 25B joins first contact segment 25A to second contact segment 25C. For example, coupler 25B joins an outer edge of first contact segment 25A to an inner edge of second contact segment 25C.

Figure 5:
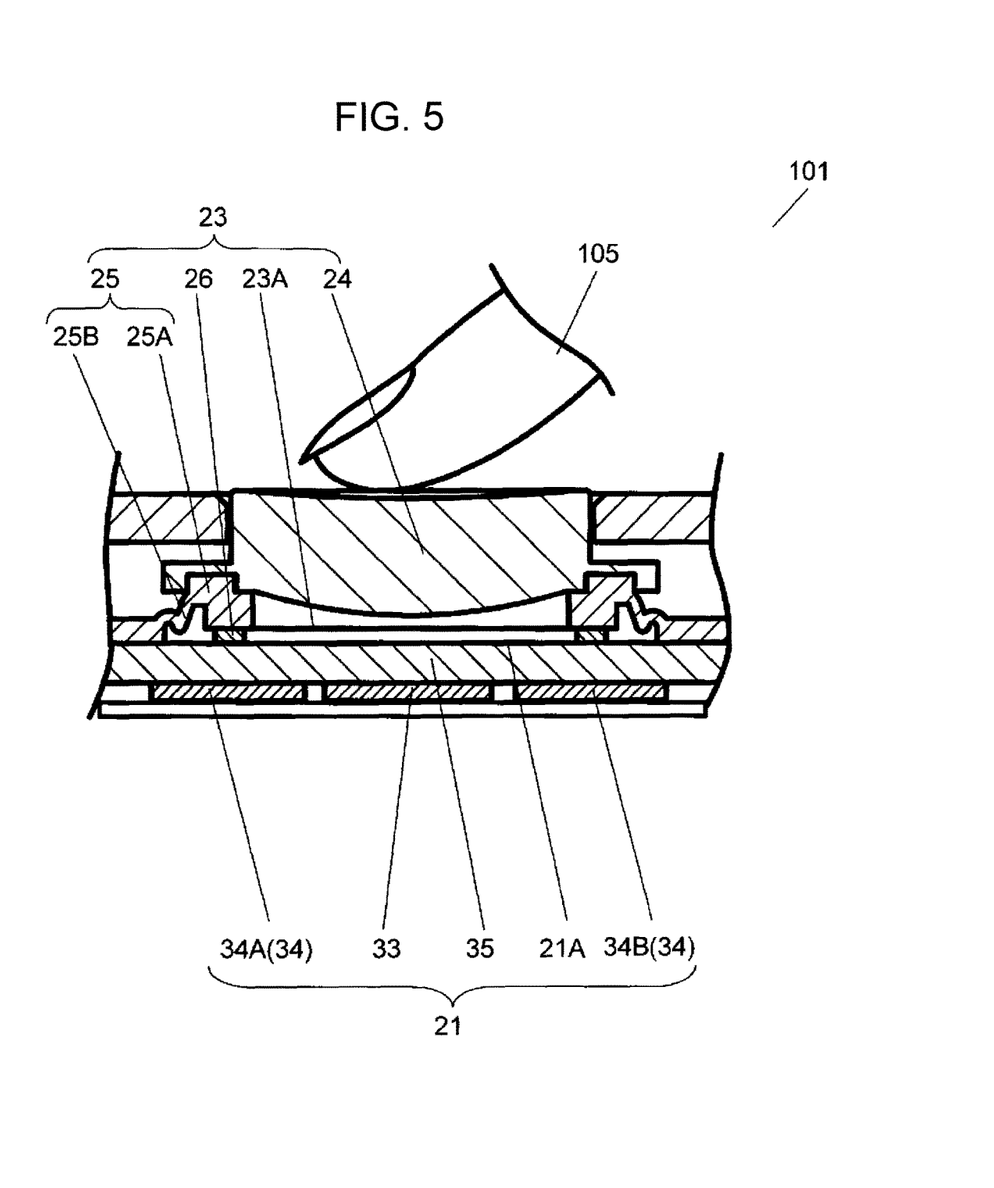
FIG. 5 is a cross-sectional view illustrating main components of input device 101 in an operation state according to the exemplary embodiment of the present invention.

FIG. 5 is a cross-sectional view illustrating main components of input device 101 in an operation state. In other words, FIG. 5 shows a state of push button 24 pressed by operator 105. As shown in FIG. 5, a press on push button 24 deforms coupler 25B. This configuration allows push button 24 to be depressed.

Figure 6:
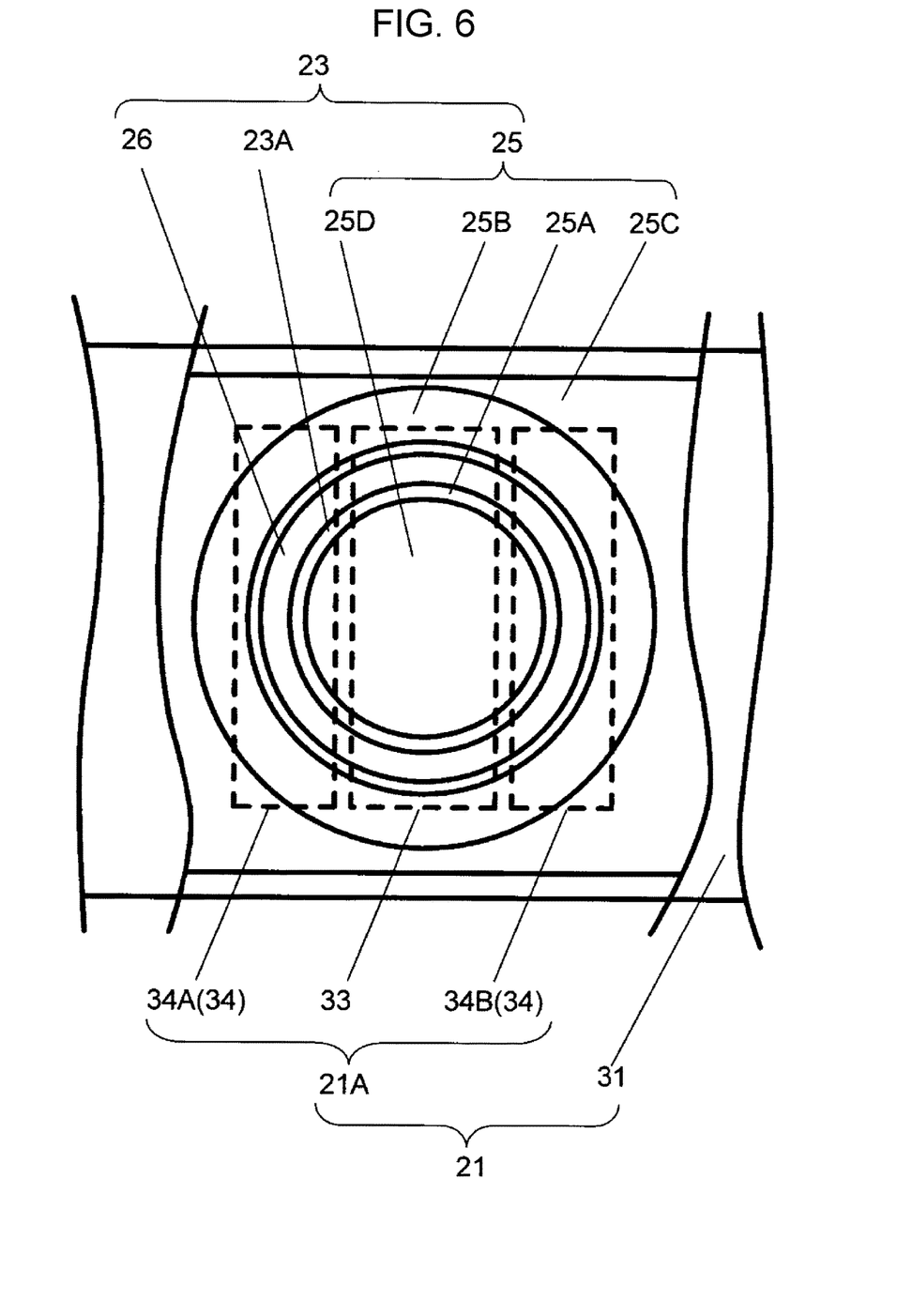
FIG. 6 is a conceptual diagram illustrating a switch electrode region of the input device according to the exemplary embodiment of the present invention.

FIG. 6 is a conceptual diagram illustrating switch electrode region 21D of input device 101. Preferably, first contact segment 25A and coupler 25B should be annular. In other words, first contact segment 25A has through hole 25D at its center. In this case, as shown in FIG. 3, light receiving part 24C should be preferably disposed inside first annular contact segment 25A. This configuration enables light from display 103 and image 104 in FIG. 4 to pass through hole 25D and reach light receiving part 24C. This configuration, as shown in FIG. 5, prevents push button 24 from slanting or slanting and moving when push button 24 is pressed. In other words, conductor 26 is kept from slanting relative to switch and ground electrodes 33 and 34. This reduces variations in distance between conductor 26 and each of switch and ground electrodes 33 and 34. This in turn reduces variations observed in capacitance value between conductor 26 and each of switch and ground electrodes 33 and 34 when push button 24 is pressed.

Preferably, first contact segment 25A should lie between operation surface 21A of touch panel 21 and push button 24 while push button 24 is pressed. Elastic body 25 is formed from a soft material such as rubber. Elastic body 25 may be formed from silicone rubber, for example. Generally, operation surface 21A of touch panel 21 and push button 24 are each formed from a firm material. This configuration prevents firm operation surface 21A and push button 24 from coming into direct contact with each other. This suppresses the generation of an unusual sound resulting from contact between operation surface 21A and push button 24. This in turn suppresses the occurrence of a scratch or other flaws on operation surface 21A and thus prevents switch and ground electrodes 33 and 34 from jutting out of insulating layer 35. Consequently, this prevents the occurrence of corrosion on switch and ground electrodes 33 and 34.

As described above, at the time of pressing push button 24, first contact segment 25A can be lowered to a degree that conductor 26 touches a surface of insulating layer 35. Thus, it is preferred that facing surface 23A be formed on first contact segment 25A. In other words, conductor 26 is disposed on first contact segment 25A so as to face operation surface 21A. This configuration contributes to a short distance between conductor 26 and switch electrode 33 or ground electrode 34 when push button 24 is pressed. This allows an increased change in the capacitance value between conductor 26 and switch electrode 33 or ground electrode 34 when push button 24 is pressed. This results in an increase in the amount of change in the capacitance value between conductor 26 and switch electrode 33 or ground electrode 34 at the time of pressing push button 24. Facing surface 23A may be formed on push button 24, other than on first contact segment 25A.

With reference to FIG. 6, conductor 26 as well is annular in shape. Preferably, conductor 26 should be disposed so as to stretch over switch and ground electrodes 33 and 34. This configuration contributes to an increased change in the capacitance value between conductor 26 and each of switch and ground electrodes 33 and 34. Preferably, ground electrode 34 should include first ground conductor 34A and second ground conductor 34B. In this case, switch electrode 33 is disposed between first and second ground conductors 34A and 34B. This configuration results in an increased change in the capacitance value between switch and ground electrodes 33 and 34.

Preferably, elastic body 25 should be formed from an opaque material. In this case, conductor 26 as well may be formed from an opaque material. Conductor 26 may be formed from carbon, for example. This can be formed by application of carbon ink to facing surface 23A. Alternatively, first contact segment 25A may double as conductor 26. In this case, first contact segment 25A is formed from conductive rubber. Elastic body 25 may be formed from a transparent material or a material having optical transparency, other than the opaque material. In the case of a plurality of push buttons 24 disposed side by side in electronic device 102 as shown in FIG. 8, elastic body 25 formed from the opaque material prevents the leakage of light incident from display 103 on push buttons 24 into adjacent push button 24. If electronic device 102 includes a plurality of push buttons 24 disposed side by side, casing 22 for a plurality of actuators 23 should preferably have single-piece construction.

With reference to FIG. 2, it is preferred that light receiving part 24C be disposed inside the position of conductor 26. Preferably, image 104 should be smaller than a region enclosed by light receiving part 24C and conductor 26. This configuration allows image 104 to be clearly displayed on operation surface 24A.

An input device according to the present invention and an electronic device including the input device have an effect of detecting an operation performed by any of fingers and other items. Thus, the input device is useful to electronic devices and the like that are operated with gloved hands and other non-conductive materials, as well as fingers.

The invention claimed is:

1. An input device comprising:
    a touch panel including a substrate and a switch electrode region disposed on the substrate, the switch electrode region including a switch electrode and a ground electrode capacitively coupled with the switch electrode;
    a casing having an inner surface facing the touch panel and an outer surface opposed to the inner surface, the casing being combined with the touch panel so as to cover the switch electrode region; and
    an actuator having:
        a push button including a first operation surface jutting out of the casing and a contact surface pressed against the inner surface;
        an elastic body pressing the contact surface against the inner surface; and
        a conductor facing the switch electrode region, and being separated from the switch and ground electrodes and being configured to move in line with a press put on the push button such that a capacitance value between the switch electrode and the ground electrode changes in response to a distance between the conductor and the switch electrode,
    wherein the conductor is formed on the actuator, and the actuator includes a facing surface disposed opposite the first operation surface.

2. The input device according to claim 1, wherein the touch panel includes a sensor electrode region disposed in a section excluding the switch electrode region on the substrate.

3. The input device according to claim 1, wherein the touch panel further includes an insulating layer formed between the switch electrode and the conductor.

4. The input device according to claim 3, wherein the substrate doubles as the insulating layer.

5. The input device according to claim 1, wherein:
    the substrate is formed from an optically transparent material, and
    the sensor electrode, the switch electrode, and the ground electrode each have optical transparency.

6. The input device according to claim 5, wherein the push button has the optical transparency.

7. The input device according to claim 6, wherein the conductor is annular.

8. The input device according to claim 7, wherein the push button includes a light receiving part inside a position of the conductor, the light receiving part receiving an incident image to be projected on the operation surface.

9. The input device according to claim 8, wherein the conductor is formed from any one of carbon ink and conductive rubber.

10. An electronic device comprising:
    the input device of claim 2 further including a second operation surface disposed in the sensor electrode region and a light receiving surface opposite to the second operation surface, in which the touch panel including the switch and ground electrodes each having optical transparency and the push button having the optical transparency have the optical transparency; and
    a display facing the light receiving surface and extending so as to cover the sensor and switch electrode regions, the display being configured to light the push button.

11. The electronic device according to claim 10, wherein:
    the push button further includes a light receiving part disposed opposite the first operation surface, and
    the display displays an image to be projected on the first operation surface.

12. The input device according to claim 1, further including a sensor electrode region formed on a same surface of the substrate as the switch electrode region surface, and the substrate has optical transparency at least in the sensor electrode region.

13. The input device accordance to claim 1, wherein a determination of whether the push button has been pressed is based on the capacitance value between the switch electrode and the ground electrode.

* * * * *